(12) United States Patent
Bhatti et al.

(10) Patent No.: US 7,497,249 B2
(45) Date of Patent: Mar. 3, 2009

(54) THERMOSIPHON FOR LAPTOP COMPUTER

(75) Inventors: Mohinder Singh Bhatti, Amherst, NY (US); Ilya Reyzin, Williamsville, NY (US); Shrikant Mukund Joshi, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/731,641

(22) Filed: Mar. 30, 2007

(65) Prior Publication Data
US 2008/0236790 A1    Oct. 2, 2008

(51) Int. Cl.
F28F 7/00        (2006.01)
H05K 7/20       (2006.01)

(52) U.S. Cl. .................. 165/80.3; 165/80.4; 165/104.33

(58) Field of Classification Search ................. 165/80.4, 165/80.3, 104.21, 104.33, 104.34; 361/699, 361/700; 257/714, 715
See application file for complete search history.

(56) References Cited

U.S. PATENT DOCUMENTS

| | | | | |
|---|---|---|---|---|
| 5,704,415 A * | 1/1998 | Suzuki et al. | ........... | 165/104.26 |
| 5,924,481 A * | 7/1999 | Tajima | ................... | 165/104.33 |
| 6,005,772 A * | 12/1999 | Terao et al. | ................. | 361/699 |
| 6,609,561 B2 * | 8/2003 | Sauciuc et al. | .......... | 165/104.33 |
| 6,834,713 B2 * | 12/2004 | Ghosh et al. | ........... | 165/104.33 |
| 6,840,311 B2 * | 1/2005 | Ghosh et al. | ........... | 165/104.33 |
| 6,863,119 B2 * | 3/2005 | Sugito et al. | ........... | 165/104.33 |
| 2006/0219387 A1 * | 10/2006 | Atarashi et al. | ............ | 165/80.4 |
| 2007/0227701 A1 * | 10/2007 | Bhatti et al. | ........... | 165/104.21 |
| 2007/0246193 A1 * | 10/2007 | Bhatti et al. | ........... | 165/104.21 |

* cited by examiner

Primary Examiner—Tho v Duong
(74) Attorney, Agent, or Firm—Patrick M. Griffen

(57) ABSTRACT

A heat exchanger assembly is provided including a multi-function boiling chamber having a top wall and a bottom wall parallel to the top wall and a first side wall and a second side wall both extending inwardly from the bottom wall to the top wall and a pair of end walls closing the chamber. First and second condensing tubes attached to the first and second side walls, respectively, of the boiling chamber have an elongated width presenting an upper surface and a lower surface and extend in opposite respective directions to distal ends of the tubes at an inclined angle relative to the bottom wall of the boiling chamber. The condensing tubes include a plurality of channels across the width and extending from the boiling chamber to the distal end of the tube. A tank disposed at each of the distal ends of the condensing tubes is in fluid communication with the channels tubes. Upper air fins extending upwardly in a plane containing the top wall of the boiling chamber and lower air fins extending downwardly in a plane containing the bottom wall of the boiling chamber engage the respective upper and lower surfaces of both condensing tubes between the respective side walls of the boiling chamber and a position adjacent the respective distal ends of the condensing tubes.

14 Claims, 1 Drawing Sheet

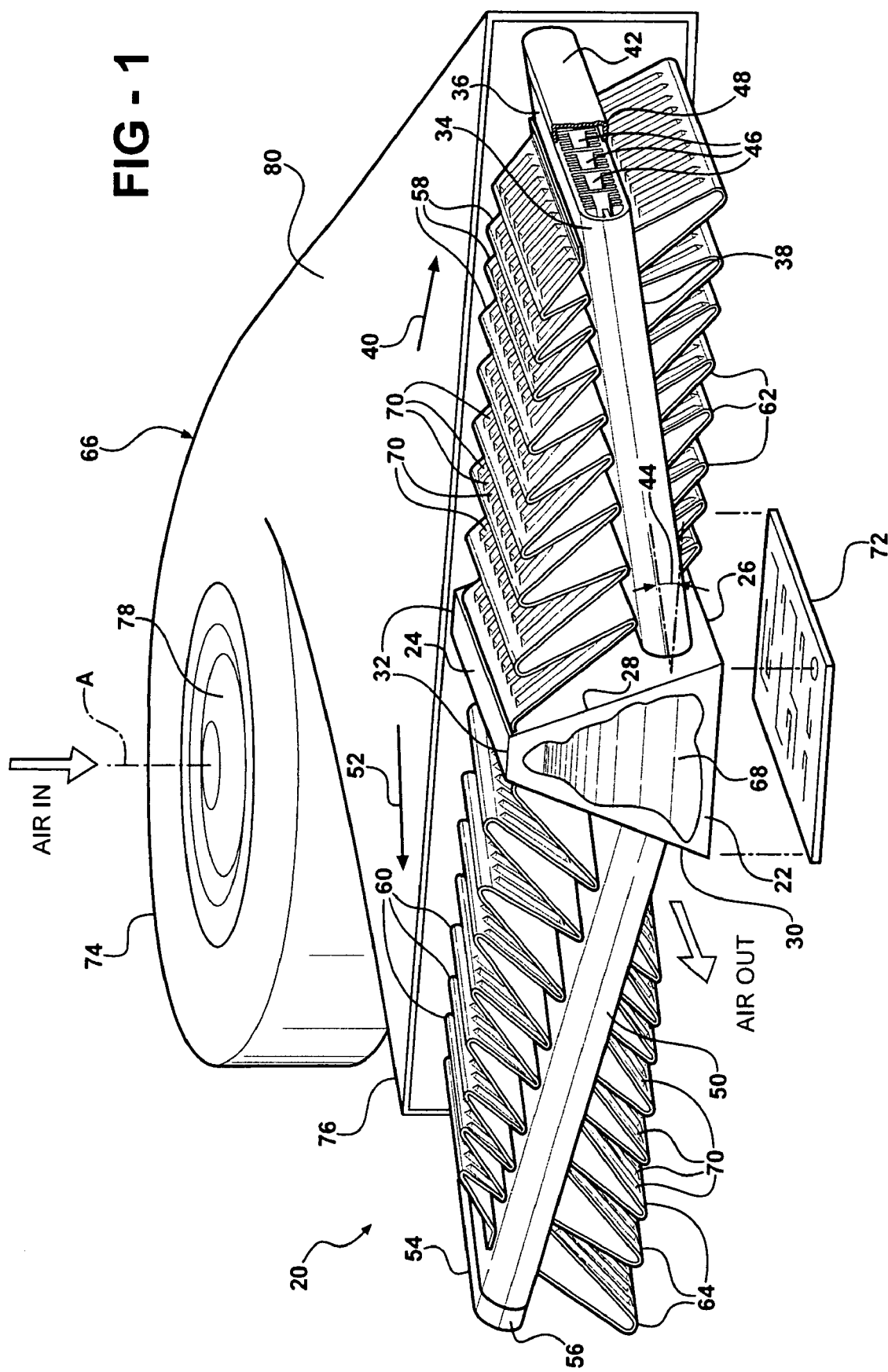

THERMOSIPHON FOR LAPTOP COMPUTER

BACKGROUND OF THE INVENTION

1. Field of the Invention

This invention relates to a heat exchanger assembly for cooling an electronic device.

2. Description of the Prior Art

The operating speed of computers is constantly being improved to create faster computers. With this, comes an increase in heat generation and a need to effectively dissipate that heat.

Heat exchangers and heat sink assemblies have been used that apply natural or forced convection cooling methods to dissipate heat from electronic devices that are highly concentrated heat sources such as microprocessors and computer chips; however, air has a relatively low heat capacity. Thus, liquid-cooled units called LCUs employing a cold plate in conjunction with high heat capacity fluids have been used to remove heat from these types of heat sources. Although, LCUs are satisfactory for moderate heat flux, increasing computing speeds have required more effective heat sink assemblies.

Accordingly, thermosiphon cooling units (TCUs) have been used for cooling electronic devices having a high heat flux. A typical TCU absorbs heat generated by the electronic device by vaporizing a working fluid housed on the boiler plate of the unit. The boiling of the working fluid constitutes a phase change from liquid-to-vapor state and as such the working fluid of the TCU is considered to be a two-phase fluid. Vapor generated during boiling of the working fluid is then transferred to a condenser, where it is liquefied by the process of film condensation over the condensing surface of the TCU. The heat is rejected into ambient air flowing over the condenser and fins are commonly employed on the condenser to increase the heat transferred from the vapor. The condensed liquid is returned back to the boiler plate by gravity.

An example of such thermosiphons include U.S. Pat. No. 6,840,311 to Ghosh et al. The Ghosh patent discloses a heat exchanger assembly including a tube having a evaporation region extending between, and in fluid communication with, sealed first and second condensation regions. The tube includes internal fins extending from the tube's outer upper and/or lower surfaces into the evaporation and condensing regions. Each of the condensation regions has two portions, extending upwardly at different angles. A working fluid flows from the evaporation region to the condensation regions and back, as a result of the changing states.

Space or volume is at a premium in computer environments and it is essential that such thermosiphons maximize heat transfer while minimizing the space occupied. In addition to minimal space, it is desirable that the thermosiphon be relatively inexpensive to fabricate. The cost of fabrication is relatively high when the thermosiphon is fabricated from especially dedicated and unique components as distinguished from being fabricated from stock materials. Although the prior art effectively dissipates heat from electronic devices, there is a continuing need for alternative designs for effectively dissipating heat in a minimum of space while remaining relatively inexpensive to fabricate.

SUMMARY OF THE INVENTION AND ADVANTAGES

The invention provides a heat exchanger assembly for cooling an electronic device comprising a multi-function boiling chamber that has a top wall and a bottom wall parallel to the top wall. A first condensing tube, having an elongated width and presenting an upper surface and a lower surface, extends in a first direction from the boiling chamber to a first distal end. A second condensing tube, having an elongated width presenting an upper surface and a lower surface, extends in a second direction from the boiling chamber to a second distal end. Both condensing tubes extend at the inclined angle relative to the bottom wall of the boiling chamber. A first plurality of upper air fins engage the upper surface of the first condensing tube between the boiling chamber and a position adjacent the first distal end of the first condensing tube and a second plurality of upper air fins engage the upper surface of the second condensing tube between the boiling chamber and a position adjacent the second distal end of the second condensing tube. A first plurality of lower air fins engage the lower surface of the first condensing tube between the boiling chamber and a position adjacent the first distal end of the first condensing tube and a second plurality of lower air fins engage the second condensing tube between the boiling chamber and a position adjacent the second distal end of the second condensing tube. Each of the first and second pluralities of upper air fins extend upwardly successively different distances from the upper surfaces of the first and second condensing tubes to a plane containing the top wall of the boiling chamber and the lower air fins extend downwardly successively different distances from the lower surfaces of the first and second condensing tubes to a plane parallel to the bottom wall of the boiling chamber.

The invention provides an alternative design for a compact thermosiphon that can be manufactured from stock parts and efficiently dissipates heat. The condensing tubes can be extruded tubing cut to the desired lengths with the boiling chamber and fins being easily formed in an analogous continuous and inexpensive process. By disposing the condensing tubes at an inclined angle they can be cut from continuously formed tubing and the fins are easily formed to fill the minimal space between the condensing tubes and the planes of the top and bottom of the boiling chamber.

BRIEF DESCRIPTION OF THE DRAWINGS

Other advantages of the present invention will be readily appreciated, as the same becomes better understood by reference to the following detailed description when considered in connection with the accompanying drawing showing a preferred embodiment of the invention in perspective and exploded.

DETAILED DESCRIPTION OF THE INVENTION

Referring to the FIGURE, wherein like numerals indicate corresponding parts throughout the several views, an assembly 20 is generally shown for cooling an electronic device.

The assembly 20 includes a boiling chamber 22 generally indicated having a top wall 24 and a bottom wall 26 parallel to the top wall 24 and a first side wall 28 and a second side wall 30 both extending inwardly from the bottom wall 26 to the top wall 24 and a pair of end walls 32 closing the chamber. A first condensing tube 34 attached to the first side wall 28 of the boiling chamber 22 has an elongated width presenting an upper surface 36 and a lower surface 38 and extends in a first direction 40 from the first side wall 28 to a first distal end 42 at an inclined angle 44 relative to the bottom wall 26 of the boiling chamber 22. The first condensing tube 34 includes a plurality of channels 46 across its width extending from the boiling chamber 22 to the first distal end 42 of the first condensing tube 34. A first tank 48 is disposed at the first distal end 42 of the first condensing tube 34. The first tank 48 is in fluid communication with the channels of the first tube 34.

A second condensing tube 50 attached to the second side wall 30 of the boiling chamber 22 has an elongated width presenting an upper surface 36 and a lower surface 38. The second condensing tube 50 extends in a second direction 52 from the second side wall 30 to a second distal end 54 at the inclined angle 44 relative to the bottom wall 26 of the boiling chamber 22. The second condensing tube 50 includes a plurality of channels 46 across its width. The channels extend from the boiling chamber 22 to the second distal end 54 of the second condensing tube 50. A second tank 56 is disposed at the second distal end 54 of the second condensing tube 50. The second tank 56 is in fluid communication with the channels of the second tube 50.

A first plurality of upper air fins 58 engage the upper surface 36 of the first condensing tube 34 between the first side wall 28 of the boiling chamber 22 and a position adjacent the first distal end 42 of the first condensing tube 34. A second plurality of upper air fins 60 engage the upper surface 36 of the second condensing tube 50 between the second side wall 30 of the boiling chamber 22 and a position adjacent the second distal end 54 of the second condensing tube 50.

A first plurality of lower air fins 62 engage the lower surface 38 of the first condensing tube 34 between the first side wall 28 of the boiling chamber 22 and a position adjacent the first distal end 42 of the first condensing tube 34. A second plurality of lower air fins 64 engage the second condensing tube 50 between the second side wall 30 of the boiling chamber 22 and a position adjacent the second distal end 54 of the second condensing tube 50.

An axial fan assembly 66 generally indicated is supported between the distal ends for moving ambient air through the upper air fins 58, 60 and the lower air fins 62, 64. The air fins 58, 60, 62, 64 may be brazed or bonded to the condensing tubes 34, 50.

The plurality of channels 46 included in the first and second condensing tubes 34, 50 may be circular or noncircular. The greater the hydraulic diameter, the lower the heat dissipation rate; the smaller the hydraulic diameter of the channels, the greater the heat dissipation rate. Thus, non-circular ports having a smaller hydraulic diameter provide a greater heat transfer rate than circular channels having a larger hydraulic diameter.

The upper air fins 58, 60 extend upwardly from the upper surfaces 36 of the first and second condensing tubes 34, 50 to a plane containing the top wall 24 of the boiling chamber 22, and the lower air fins 62, 64 extend downwardly from the lower surfaces 38 of the first and second condensing tubes 34, 50 to a plane parallel with the bottom wall 26 of the boiling chamber 22. The first plurality of upper air fins 58 are defined by a first continuous sheet having a leading edge transversely engaging the first side wall 28 at the top wall 24 and a trailing edge transversely engaging the first condensing tube 34 adjacent the first distal end 42 of the first condensing tube 34. The first continuous sheet defines v-shaped loops having lower apexes engaging the upper surface 36 of the first condensing tube 34 and upper apexes aligned in a plane containing the top wall 24 of the boiling chamber 22. Each of the v-shaped loops extends downwardly in first and second legs from an upper apex with the first leg being closer to the boiling chamber 22 and extending at a greater angle relative to the first condensing tube 34 than a lesser angle of the second leg.

The second plurality of upper air fins 60 is defined by a second continuous sheet having a leading edge transversely engaging the second side wall 30 at the top wall 24 and a trailing edge transversely engaging the second condensing tube 50 adjacent the second distal end 54 of the second condensing tube 50. The second continuous sheet defines v-shaped loops having lower apexes engaging the upper surface 36 of the second condensing tube 50 and upper apexes aligned in a plane containing the top wall 24 of the boiling chamber 22. Each of the v-shaped loops extends downwardly in first and second legs from an upper apex with the first leg being closer to the boiling chamber 22 and extending at a greater angle relative to the second condensing tube 50 than a lesser angle of the second leg.

The first plurality of lower air fins 62 is defined by a third continuous sheet having a leading edge transversely engaging the first side wall 28 adjacent the bottom wall 26 and a trailing edge transversely engaging the first condensing tube 34 adjacent the first distal end 42 of the first condensing tube 34. The third continuous sheet defines v-shaped loops having upper apexes engaging the lower surface 38 of the first condensing tube 34 and lower apexes aligned in a plane parallel with the bottom wall 26 of the boiling chamber 22. Each of the v-shaped loops extends upwardly in first and second legs from a lower apex with the first leg being closer to the boiling chamber 22 and extending at a lesser angle relative to the first condensing tube 34 than the second leg.

The second plurality of lower air fins 64 is defined by a fourth continuous sheet having a leading edge transversely engaging the second side wall 30 adjacent the bottom wall 26 and a trailing edge transversely engaging the second condensing tube 50 adjacent the second distal end 54 of the second condensing tube 50. The fourth continuous sheet defines v-shaped loops having upper apexes engaging the lower surface 38 of the second condensing tube 50 and lower apexes aligned in a plane parallel to the bottom wall 26 of the boiling chamber 22. Each of the v-shaped loops extends upwardly in first and second legs from a lower apex with the first leg being closer to the boiling chamber 22 and extending at a lesser angle relative to the second condensing tube 50 than the second leg.

In operation, heat generated from the electronic device is transferred into the boiling chamber 22 which causes a refrigerant 68 located in the boiling chamber 22 to boil. Boiling of the refrigerant 68 generates a vapor in the boiling chamber 22. The vapor is transferred through the first and second side walls 28, 30 of the boiling chamber 22 into the first and second condensing tubes 34, 50 which are attached to the first and second side walls 28, 30 respectively. The heat from the vapor in the first and second condensing tubes 34, 50 is transferred through the plurality of channels 46 of the first and second condensing tubes 34, 50 across the width of each of the first and second condensing tubes 34, 50 to the pluralities of upper air fins 58, 60 and lower air fins 62, 64. Some heat from the vapor is also dissipated by the side walls 28, 30, top wall 24, and a pair of end walls 32 of the boiling chamber 22. The multiple functions provided by the boiling chamber 22 of both transmitting and dissipating heat allow the assembly 20 to dissipate heat efficiently. The arrangement of the upper air fins 58, 60 and lower air fins 62, 64 engaging the surface of condensing tubes 34, 50 on an inclined angle 44 relative to the boiling chamber 22 causes condensed liquid refrigerant 68 to drain into the boiling chamber 22 by gravity. The inclusion of upper air fins 58, 60 and lower air fins 62, 64 provides a greater overall surface area for dissipation of heat on the air side, thereby increasing the efficiency of assembly 20.

The pluralities of upper air fins 58, 60 and lower air fins 62, 64 each include louvers 70, which increase the heat transfer coefficient and the rate at which the assembly 20 dissipates heat, by interrupting the thermal boundary layers formed on the upper air fins 58, 60 and the lower air fins 62, 64.

The respective variable heights of the first plurality of upper air fins 58 and the first plurality of lower air fins 62, as well as the respective variable heights of the second plurality of upper air fins 60 and the second plurality of lower air fins 64, provide uniform heat dissipation, respectively, from the first and second condensing tubes 34, 50. The assembly 20 is thus orientation insensitive in the two common operating positions of a laptop computer. For example, regardless of whether the assembly 20 is tilted in the first direction 40 or in the second direction 52, liquid refrigerant 68 is always present to cover the heat generating element 72 to prevent it from burning.

A fan assembly 66, generally indicated, is attached to and extends the width of the heat exchange assembly 20, between the distal end of first condensing tube 34 and extending to the distal end of the second condensing tube 50. The fan assembly 66 includes at least one fan for blowing air through the air fins 58, 60, 62, 64 of the heat exchange assembly 20.

In the embodiment shown in FIG. 1, the fan assembly 66 includes a fan housing 74 having a spiral periphery extending about a fan axis A to an exhaust 76. The fan blower 78 is supported for rotation about the fan axis A. A conical portion 80 extends between the exhaust 76 of the fan housing 74 and the first and second condensing tubes 34, 50 for directing air from the exhaust 76 to the first and second condensing tubes 34, 50 and through the first and second pluralities of upper air fins 58, 60 and the first and second pluralities of lower air fins 62, 64. The conical portion 80 has a rectangular cross-sectional area that increases in size from the exhaust 76 of the fan housing 74 to the first and second condensing tubes 34, 50. Ambient air enters the fan assembly 66 along the fan axis A and is discharged in the direction of the heat exchange assembly 20 as the fan blower 78 spins. Air is discharged from the heat exchange assembly 20 in a direction normal to the fan axis A.

The configuration of the heat exchanger assembly 20 also makes it suitable for use in cooperation with a low height cross flow fan.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A heat exchanger assembly for cooling an electronic device comprising;
    a boiling chamber having a top wall and a bottom wall parallel to said top wall,
    a first condensing tube having an elongated width presenting an upper surface and a lower surface and extending in a first direction from said boiling chamber to a first distal end at an inclined angle relative to said bottom wall of said boiling chamber,
    a second condensing tube having an elongated width presenting an upper surface and a lower surface and extending in a second direction from said boiling chamber to a second distal end at said inclined angle relative to said bottom wall of said boiling chamber,
    a first plurality of upper air fins engaging said upper surface of said first condensing tube between said boiling chamber and a position adjacent said first distal end of said first condensing tube,
    a second plurality of upper air fins engaging said upper surface of said second condensing tube between said boiling chamber and a position adjacent said second distal end of said second condensing tube,
    a first plurality of lower air fins engaging said lower surface of said first condensing tube between said boiling chamber and a position adjacent said first distal end of said first condensing tube,
    a second plurality of lower air fins engaging said second condensing tube between said boiling chamber and a position adjacent said second distal end of said second condensing tube,
    each of said first and second pluralities of upper air fins extending upwardly successively different distances from said upper surfaces of said condensing tubes to a plane containing said top wall of said boiling chamber, and
    each of said lower air fins extending downwardly successively different distances from said lower surfaces of said condensing tubes to a plane parallel to said bottom wall of said boiling chamber,
    wherein said boiling chamber includes a first side wall and a second side wall both extending inwardly from said bottom wall to said top wall, thereby defining a substantially trapezoidal cross sectional area and a pair of end walls closing said chamber.

2. A heat exchanger assembly for cooling an electronic device as set forth in claim 1 further wherein said first condensing tube is attached to said first side wall of said boiling chamber and extends in said first direction from said first side wall to the first distal end and wherein said second condensing tube is attached to said second side wall of said boiling chamber and extends in said second direction from said second side wall to the second distal end.

3. A heat exchanger assembly as set forth in claim 2 wherein said first condensing tube includes a plurality of channels across said width and extending from said boiling chamber to said first distal end, and wherein said second condensing tube includes a plurality of channels across said width extending from said boiling chamber to said second distal end.

4. A heat exchanger assembly as set forth in claim 3 further comprising a first tank disposed at said first distal end of said first condensing tube in fluid communication with said channels of said first condensing tube, and a second tank disposed at said second distal end of said condensing tube in fluid communication with said channels of said second condensing tube.

5. A heat exchanger assembly as set forth in claim 4 wherein said first plurality of upper air fins engage said first side wall of said boiling chamber, and said second plurality of upper air fins engage said second side wall of said boiling chamber.

6. A heat exchanger assembly as set forth in claim 5 wherein said first plurality of lower air fins engage said first side wall of said boiling chamber, and said second plurality of lower air fins engage said second side wall of said boiling chamber.

7. A heat exchanger assembly as set forth in claim 1 wherein said first plurality of upper air fins are defined by a first continuous sheet having a leading edge transversely engaging said first side wall at said top wall and a trailing edge transversely engaging said first condensing tube adjacent said first distal end of said first condensing tube, said second plurality of upper air fins defined by a second continuous sheet having a leading edge transversely engaging said second side wall at said top wall and a trailing edge transversely engaging said second condensing tube adjacent said second distal end of said second condensing tube, said first plurality of lower air fins defined by a third continuous sheet having a leading edge transversely engaging said first side wall adjacent said bottom wall and a trailing edge transversely engaging said first condensing tube adjacent said first distal end of said first condensing tube, and said second plurality of lower air fins defined by a fourth continuous sheet having a leading edge transversely engaging said second side wall adjacent said bottom wall and a trailing edge transversely engaging said second condensing tube adjacent said second distal end of said second condensing tube.

8. A heat exchanger assembly for cooling an electronic device as set forth in claim 7 wherein said first continuous sheet defines v-shaped loops having lower apexes engaging said upper surface of said first condensing tube and upper apexes aligned in a plane containing said top wall of said boiling chamber, said second continuous sheet defines v-shaped loops having lower apexes engaging said upper surface of said second condensing tube and upper apexes aligned in a plane containing said top wall of said boiling chamber, said third continuous sheet defines v-shaped loops having upper apexes engaging said lower surface of said first condensing tube and lower apexes aligned in a plane parallel with said bottom wall of said boiling chamber, and said fourth continuous sheet defines v-shaped loops having upper apexes engaging said lower surface of said second condensing tube and lower apexes aligned in a plane parallel to said bottom wall of said boiling chamber.

9. A heat exchanger assembly for cooling an electronic device comprising;
   a boiling chamber having a top wall and a bottom wall parallel to said top wall,
   a first condensing tube having an elongated width presenting an upper surface and a lower surface and extending in a first direction from said boiling chamber to a first distal end at an inclined angle relative to said bottom wall of said boiling chamber,
   a second condensing tube having an elongated width presenting an upper surface and a lower surface and extending in a second direction from said boiling chamber to a second distal end at said inclined angle relative to said bottom wall of said boiling chamber,
   a first plurality of upper air fins engaging said upper surface of said first condensing tube between said boiling chamber and a position adjacent said first distal end of said first condensing tube,
   a second plurality of upper air fins engaging said upper surface of said second condensing tube between said boiling chamber and a position adjacent said second distal end of said second condensing tube,
   a first plurality of lower air fins engaging said lower surface of said first condensing tube between said boiling chamber and a position adjacent said first distal end of said first condensing tube,
   a second plurality of lower air fins engaging said second condensing tube between said boiling chamber and a position adjacent said second distal end of said second condensing tube,
   each of said first and second pluralities of upper air fins extending upwardly successively different distances from said upper surfaces of said condensing tubes to a plane containing said top wall of said boiling chamber, and
   each of said lower air fins extending downwardly successively different distances from said lower surfaces of said condensing tubes to a plane parallel to said bottom wall of said boiling chamber;
   wherein said first plurality of upper air fins are defined by a first continuous sheet having a leading edge transversely engaging said first side wall at said top wall and a trailing edge transversely engaging said first condensing tube adjacent said first distal end of said first condensing tube, said second plurality of upper air fins defined by a second continuous sheet having a leading edge transversely engaging said second side wall at said top wall and a trailing edge transversely engaging said second condensing tube adjacent said second distal end of said second condensing tube, said first plurality of lower air fins defined by a third continuous sheet having a leading edge transversely engaging said first side wall adjacent said bottom wall and a trailing edge transversely engaging said first condensing tube adjacent said first distal end of said first condensing tube, and said second plurality of lower air fins defined by a fourth continuous sheet having a leading edge transversely engaging said second side wall adjacent said bottom wall and a trailing edge transversely engaging said second condensing tube adjacent said second distal end of said second condensing tube,
   wherein said first continuous sheet defines v-shaped loops having lower apexes engaging said upper surface of said first condensing tube and upper apexes aligned in a plane containing said top wall of said boiling chamber, said second continuous sheet defines v-shaped loops having lower apexes engaging said upper surface of said second condensing tube and upper apexes aligned in a plane containing said top wall of said boiling chamber, said third continuous sheet defines v-shaped loops having upper apexes engaging said lower surface of said first condensing tube and lower apexes aligned in a plane parallel with said bottom wall of said boiling chamber, and said fourth continuous sheet defines v-shaped loops having upper apexes engaging said lower surface of said second condensing tube and lower apexes aligned in a plane parallel to said bottom wall of said boiling chamber; and
   wherein each of said v-shaped loops defined by said first continuous sheet extend downwardly in first and second legs from an upper apex with said first leg being closer to said boiling chamber and to extend at a greater angle relative to said first condensing tube than a lesser angle of said second leg, each of said v-shaped loops defined by said second continuous sheet extend downwardly in third and fourth legs from an upper apex with said first leg being closer to said boiling chamber to extend at a greater angle relative to said second condensing tube than a lesser angle of said fourth leg, each of said v-shaped loops defined by said third continuous sheet extend upwardly in fifth and sixth legs from a lower apex with said fifth leg being closer to said boiling chamber to extend at a lesser angle relative to said first condensing tube than said sixth leg, and each of said v-shaped loops defined by said fourth continuous sheet extend upwardly in seventh and eighth legs from a lower apex with said seventh leg being closer to said boiling chamber to extend at a lesser angle relative to said second condensing tube than said eighth leg.

10. A heat exchanger assembly as set forth in claim 1 further comprising a first tank disposed at said first distal end of said first condensing tube in fluid communication with said first tube and a second tank disposed at said second distal end of said second condensing tube in fluid communication with said second tube, said first tank being sealed to and in communication with said first condensing tube and said second tank being sealed to and in communication with said second condensing tube.

11. A heat exchanger assembly as set forth in claim 1 further comprising a fan assembly supported between said distal ends for moving air through said air fins.

12. A heat exchanger assembly as set forth in claim 1 wherein said first plurality of upper air fins is bonded to said upper surface of said first condensing tube, said second plurality of upper air fins is bonded to said lower surface of said first condensing tube, said first plurality of upper air fins is bonded to said upper surface of said first condensing tube, and said second plurality of lower air fins is bonded to said lower surface of said second condensing tube.

13. A heat exchanger assembly as set forth in claim 9 wherein said first plurality of upper air fins is brazed to said upper surface of said first condensing tube, said second plurality of upper air fins is brazed to said lower surface of said first condensing tube, said first plurality of upper air fins is brazed to said upper surface of said first condensing tube, and said second plurality of lower air fins is brazed to said lower surface of said second condensing tube.

14. A heat exchanger assembly for cooling an electronic device comprising;

a boiling chamber having a top wall and a bottom wall parallel to said top wall and a first side wall and a second side wall both extending inwardly from said bottom wall to said top wall and a pair of end walls closing said chamber, a first condensing tube attached to said first side wall of said boiling chamber having an elongated width presenting an upper surface and a lower surface and extending in a first direction from said first side wall to a first distal end at an inclined angle relative to said bottom wall of said boiling chamber, said first tube including a plurality of channels across said width and extending from said boiling chamber to said first distal end, a first tank disposed at said first distal end of said first condensing tube in fluid communication with said channels of said first tube, a second condensing tube attached to said second side wall of said boiling chamber having an elongated width presenting an upper surface and a lower surface and extending in a second direction from said second side wall to a second distal end at said inclined angle relative to said bottom wall of said boiling chamber, said second tube including a plurality of channels across said width extending from said boiling chamber to said second distal end, a second tank disposed at said second distal end of said second condensing tube in fluid communication with said channels of said second tube, a first plurality of upper air fins engaging said upper surface of said first condensing tube between said first side wall of said boiling chamber and a position adjacent said first distal end of said first condensing tube, a second plurality of upper air fins engaging said upper surface of said second condensing tube between said second side wall of said boiling chamber and a position adjacent said second distal end of said second condensing tube, a first plurality of lower air fins engaging said lower surface of said first condensing tube between said first side wall of said boiling chamber and a position adjacent said first distal end of said first condensing tube, a second plurality of lower air fins engaging said second condensing tube between said second side wall of said boiling chamber and a position adjacent said second distal end of said second condensing tube, a fan assembly being supported between said distal ends for moving air through said air fins and having a fan housing with a spiral periphery extending about a fan axis to an exhaust and a fan blower supported for rotation about said fan axis, said upper air fins extending upwardly from said upper surfaces of said condensing tubes to a plane containing said top wall of said boiling chamber, and said lower air fins extending downwardly from said lower surfaces of said condensing tubes to a plane parallel with said bottom wall of said boiling chamber, said first upper air fins defined by a first continuous sheet having a leading edge transversely engaging said first side wall at said top wall and a trailing edge transversely engaging said first condensing tube adjacent said first distal end of said first condensing tube, said first continuous sheet defining v-shaped loops having lower apexes engaging said upper surface of said first condensing tube and upper apexes aligned in a plane containing said top wall of said boiling chamber, each of said v-shaped loops extending downwardly in first and second legs from an upper apex with said first leg being closer to said boiling chamber and extending at a greater angle relative to said first condensing tube than a lesser angle of said second leg, said second plurality of upper air fins defined by a second continuous sheet having a leading edge transversely engaging said second side wall at said top wall and a trailing edge transversely engaging said second condensing tube adjacent said second distal end of said second condensing tube, said second continuous sheet defining v-shaped loops having lower apexes engaging said upper surface of said second condensing tube and upper apexes aligned in a plane containing said top wall of said boiling chamber, each of said v-shaped loops extending downwardly in first and second legs from an upper apex with said first leg being closer to said boiling chamber and extending at a greater angle relative to said second condensing tube than a lesser angle of said second leg, said first plurality of lower air fins defined by a third continuous sheet having a leading edge transversely engaging said first side wall adjacent said bottom wall and a trailing edge transversely engaging said first condensing tube adjacent said first distal end of said first condensing tube, said third continuous sheet defining v-shaped loops having upper apexes engaging said lower surface of said first condensing tube and lower apexes aligned in a plane parallel with said bottom wall of said boiling chamber, each of said v-shaped loops extending upwardly in first and second legs from a lower apex with said first leg being closer to said boiling chamber and extending at a lesser angle relative to said first condensing tube than said second leg, said second plurality of lower air fins defined by a fourth continuous sheet having a leading edge transversely engaging said second side wall adjacent said bottom wall and a trailing edge transversely engaging said second condensing tube adjacent said second distal end of said second condensing tube, said fourth continuous sheet defining v-shaped loops having upper apexes engaging said lower surface of said second condensing tube and lower apexes aligned in a plane parallel to said bottom wall of said boiling chamber, each of said v-shaped loops extending upwardly in first and second legs from a lower apex with said first leg being closer to said boiling chamber and extending at a lesser angle relative to said second condensing tube than said second leg.

* * * * *